(12) United States Patent  
Watanabe

(10) Patent No.: US 10,978,586 B2  
(45) Date of Patent: Apr. 13, 2021

(54) SWITCHING DEVICE

(71) Applicant: DENSO CORPORATION, Kariya (JP)

(72) Inventor: Atsushi Watanabe, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/557,299

(22) Filed: Aug. 30, 2019

(65) Prior Publication Data

US 2020/0075757 A1    Mar. 5, 2020

(30) Foreign Application Priority Data

Aug. 31, 2018 (JP) .............................. JP2018-163960

(51) Int. Cl.
| | |
|---|---|
| H01L 29/78 | (2006.01) |
| H01L 21/28 | (2006.01) |
| H01L 29/49 | (2006.01) |
| H01L 29/417 | (2006.01) |
| H01L 29/10 | (2006.01) |
| H01L 29/808 | (2006.01) |
| H01L 29/06 | (2006.01) |
| H01L 29/08 | (2006.01) |

(52) U.S. Cl.
CPC .......... H01L 29/7813 (2013.01); H01L 21/28 (2013.01); H01L 29/0692 (2013.01); H01L 29/0878 (2013.01); H01L 29/1095 (2013.01); H01L 29/41766 (2013.01); H01L 29/49 (2013.01); H01L 29/7803 (2013.01); H01L 29/8083 (2013.01)

(58) Field of Classification Search
CPC . H01L 29/7802; H01L 29/7813; H01L 29/78; H01L 29/0693
See application file for complete search history.

(56) References Cited

U.S. PATENT DOCUMENTS

2015/0206998 A1* 7/2015 Kapur ............. H01L 31/022458  
136/256  
2016/0218188 A1* 7/2016 Hiyoshi .............. H01L 29/4236  
2018/0301540 A1* 10/2018 Ando .................... H01L 29/517

FOREIGN PATENT DOCUMENTS

JP     2011-146426 A     7/2011

* cited by examiner

*Primary Examiner* — Changhyun Yi  
(74) *Attorney, Agent, or Firm* — Hunton Andrews Kurth LLP

(57) ABSTRACT

A switching device may include: a n-type source layer; a p-type body layer in contact with the source layer; a n-type drift layer in contact with the body layer; a gate insulating film covering a range extending across a surface of the source layer, a surface of the body layer, and a surface of the drift layer; and a gate electrode opposed to the source layer, the body layer, and the drift layer via the gate insulating film, wherein the gate electrode includes a first electric conductor and a second electric conductor having a work function smaller than a work function of the first electric conductor, the first electric conductor is in contact with a part of the gate insulating film covering the body layer, and the second electric conductor is in contact with a part of the gate insulating film covering the drift layer.

7 Claims, 5 Drawing Sheets

SWITCHING DEVICE

CROSS-REFERENCE TO RELATED APPLICATION

The present application claims priority to Japanese Patent Application No. 2018-163960 filed on Aug. 31, 2018, which is incorporated herein by reference in its entirety.

TECHNICAL FIELD

A technology disclosed herein relates to a switching device.

BACKGROUND

A switching device in Japanese Patent Application Publication No. 2011-146426 includes a source layer of n-type, a body layer of p-type, and a drift layer of n-type. The source layer is disposed at a surface of a semiconductor substrate. The body layer is disposed at the surface of the semiconductor substrate at a position adjacent to the source layer. The drift layer is disposed at the surface of the semiconductor substrate at a position adjacent to the body layer. A gate insulating film covers a range extending across a surface of the source layer, a surface of the body layer, and a surface of the drift layer. A gate electrode is opposed to the source layer, the body layer, and the drift layer with the gate insulating film interposed therebetween.

SUMMARY

When the potential of the gate electrode is raised, electrons are attracted to a region in the body layer close to the gate insulating film, and a channel is formed in the region. This causes a flow of electrons from the source layer to the drift layer via the channel. Moreover, when the potential of the gate electrode is raised, electrons are attracted to a region in the drift layer close to the gate insulating film, and an electron accumulation layer having low resistance is formed in the drift layer. Electrons that have passed through the channel, therefore, flow in the electron accumulation layer in the drift layer. The formation of the electron accumulation layer in the drift layer reduces an on-resistance of the switching device.

Decreasing the work function of the gate electrode causes more easily electrons to be attracted to the region in the drift layer close to the gate insulating film. Accordingly, decreasing the work function of the gate electrode increases the concentration of electrons in the electron accumulation layer, and can further reduce the resistance of the electron accumulation layer. However, decreasing the work function of the gate electrode causes also more easily electrons to be attracted to the region in the body layer close to the gate insulating film, and hence a channel is more easily formed. This lowers a gate threshold value. As such, there had been a problem where reducing the resistance of the electron accumulation layer led to the lowered gate threshold value. Therefore, the present specification proposes a technology of allowing for a high gate threshold value while reducing the resistance of an electron accumulation layer.

A switching device disclosed in the present disclosure may comprise: a source layer of n-type; a body layer of p-type being in contact with the source layer; a drift layer of n-type being in contact with the body layer and separated from the source layer by the body layer; a gate insulating film covering a range extending across a surface of the source layer, a surface of the body layer, and a surface of the drift layer, and a gate electrode opposed to the source layer, the body layer, and the drift layer via the gate insulating film, wherein the gate electrode comprises a first electric conductor and a second electric conductor having a work function smaller than a work function of the first electric conductor, the first electric conductor is in contact with a part of the gate insulating film covering the body layer, and the second electric conductor is in contact with a part of the gate insulating film covering the drift layer.

Notably, the switching device described above may be of a planar type (a type in which the gate electrode is provided on a semiconductor substrate) or of a trench type (a type in which the gate electrode is provided in a trench).

In this switching device, the first electric conductor having a larger work function is in contact with the part of the gate insulating film covering the body layer. A channel is therefore less easily formed in a part of the body layer opposed to the first electric conductor. As such, if a region where a channel is less easily formed exists in at least a part of the body layer, the gate threshold value becomes high because the switching device is not turned on until a channel has been formed in that region where a channel is less easily formed. This switching device therefore has a high gate threshold value. Moreover, in this switching device, the second electric conductor having a smaller work function is in contact with the part of the gate insulating film covering the drift layer. Therefore, in a part of the drift layer opposed to the second electric conductor, an electron accumulation layer having particularly low electrical resistance is formed. As such, the formation of the electron accumulation layer having particularly low electrical resistance in the drift layer reduces the on-resistance of the switching device. As described above, this switching device can allow for a high gate threshold value while reducing the resistance of the electron accumulation layer.

DETAILED DESCRIPTION

Figure 1:
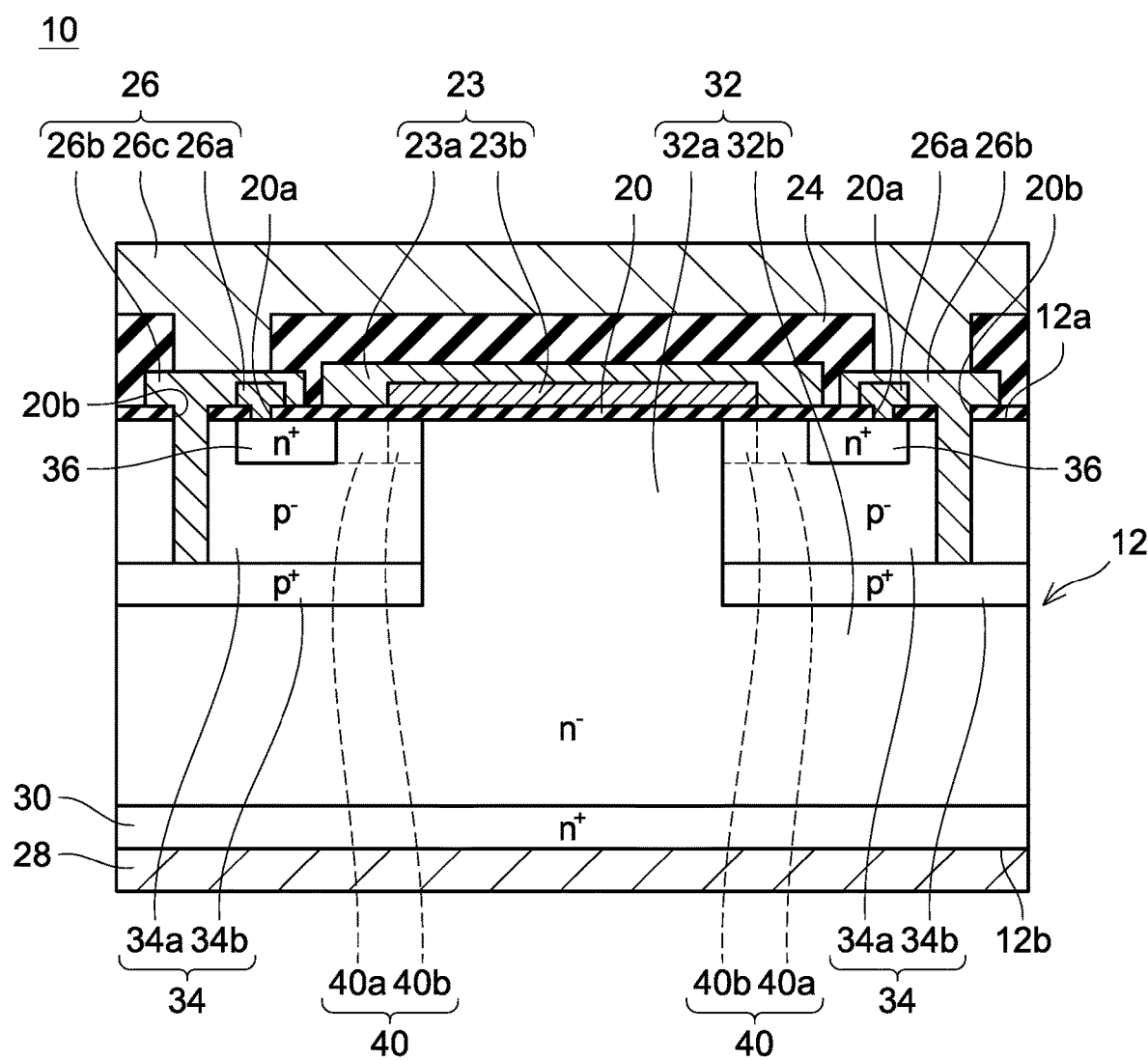
FIG. 1 is a cross-sectional view of a switching device in an embodiment.

A switching device 10 in an embodiment shown in FIG. 1 is a metal-oxide-semiconductor field effect transistor (MOSFET). The switching device 10 comprises a semiconductor substrate 12. The semiconductor substrate 12 is constituted of gallium nitride (GaN). The semiconductor substrate 12 includes a drain layer 30, a drift layer 32, body layers 34, and source layers 36.

The drain layer 30 is an n-type layer. The drain layer 30 is located in a range including a lower surface 12b of the semiconductor substrate 12.

The drift layer 32 is an n-type layer having a lower n-type impurity concentration than the drain layer 30. The drift layer 32 is located on the drain layer 30.

The body layers 34 are p-type layers. The plurality of body layers 34 is located at intervals on the drift layer 32. Each body layer 34 is located in a range including an upper surface 12a of the semiconductor substrate 12. Between each pair of the body layers 34, the drift layer 32 extends to the upper surface 12a of the semiconductor substrate 12. A part of the drift layer 32 located between each pair of the body layers 34 will hereinafter be termed a window drift layer 32a. Moreover, a part of the drift layer 32 located lower than the body layers 34 will be termed a base drift layer 32b. The window drift layer 32a is in contact with a side surface of each body layer 34. The base drift layer 32b is in contact with a lower surface of each body layer 34. Each body layer 34 includes a low concentration layer 34a and a high concentration layer 34b. The high concentration layers 34b have a higher p-type impurity concentration than the low concentration layers 34a. Each high concentration layer 34b constitutes the lower surface of its body layer 34. Each low concentration layer 34a is located on the corresponding high concentration layer 34b. Each low concentration layer 34a is located in a range including the upper surface 12a of the semiconductor substrate 12.

The source layers 36 are n-type layers. The plurality of source layers 36 is provided in the semiconductor substrate 12. Each source layer 36 is located in a range surrounded by the low concentration layer 34a of the corresponding body layer 34. Each source layer 36 is located in a range including the upper surface 12a of the semiconductor substrate 12. Each source layer 36 is separated from the drift layer 32 by the corresponding body layer 34.

A gate insulating film 20, a gate electrode 23, interlayer insulating films 24, and an upper electrode 26 are disposed above the semiconductor substrate.

The gate insulating film 20 covers the upper surface 12a of the semiconductor substrate 12. The gate insulating film 20 is constituted of silicon oxide ($SiO_2$) or the like. The gate insulating film 20 covers a range extending across surfaces of the source layers 36, surfaces of the low concentration layers 34a, and a surface of the window drift layer 32a. The gate insulating film 20 covers an entire surface of a part (a channel portion 40) of each low concentration layer 34a between the corresponding source layer 36 and the window drift layer 32a. Moreover, the gate insulating film 20 covers an entire surface of the window drift layer 32a. The gate insulating film 20 is provided with contact holes 20a and 20b. Each contact hole 20a reaches the corresponding source layer 36. Each contact hole 20b extends into the semiconductor substrate 12, and reaches the corresponding high concentration layer 34b.

The gate electrode 23 covers a surface of the gate insulating film 20. The gate electrode 23 is located above the source layers 36, the channel portions 40, and the window drift layer 32a. The gate electrode 23 is opposed to the source layers 36, the channel portions 40, and the window drift layer 32a with the gate insulating film 20 interposed between the gate electrode 23 and the source layers 36, the channel portions 40, and the window drift layer 32a.

The gate electrode 23 comprises a first electric conductor 23a and a second electric conductor 23b. The second electric conductor 23b has a work function smaller than a work function of the first electric conductor 23a. The first electric conductor 23a is constituted of titanium, aluminum, n-type polysilicon, or the like. The second electric conductor 23b is constituted of nickel, gold, platinum, palladium, p-type polysilicon, or the like. The second electric conductor 23b is in contact with an entire surface of a part of the gate insulating film 20 that covers the window drift layer 32a. Moreover, the second electric conductor 23b extends from above the window drift layer 32a to above the channel portions 40. The second electric conductor 23b is in contact with a surface of a part of the gate insulating film 20 that covers the channel portions 40 close to the window drift layer 32a. In other words, the second electric conductor 23b is in contact with a surface of a part of the gate insulating film 20 that covers borders between each body layer 34 and the window drift layer 32a. The first electric conductor 23a covers the gate insulating film 20 and the second electric conductor 23b. The first electric conductor 23a is in contact with a surface of a part of the gate insulating film 20 which covers the source layers 36 and the channel portions 40. The first electric conductor 23a is in contact with a surface of a part of the gate insulating film 20 that covers the channel portions 40 that are close to the corresponding source layers 36. Each channel portion 40 below a part where the first electric conductor 23a and the gate insulating film 20 are in contact will hereinafter be termed a first channel portion 40a, and each channel portion 40 below a part where the second electric conductor 23b and the gate insulating film 20 are in contact will hereinafter be termed a second channel portion 40b.

The interlayer insulating films 24 cover the gate electrode 23.

The upper electrode 26 comprises source contact portions 26a, body contact portions 26b, and a surface portion 26c. Each source contact portion 26a is located above the corresponding source layer 36. Each source contact portion 26a is in contact with the corresponding source layer 36 within the corresponding contact hole 20a. Each body contact portion 26b is located above the corresponding body layer 34. Each body contact portion 26b is in contact with the corresponding high concentration layer 34b within the corresponding contact hole 20b. Each body contact portion 26b is in contact with the adjacent source contact portion 26a. The surface portion 26c is located on the interlayer insulating films 24. The surface portion 26c is in contact with each body contact portion 26b. The upper electrode 26 is insulated from the gate electrode 23 by the interlayer insulating films 24.

A lower electrode 28 is located below the semiconductor substrate 12. The lower electrode 28 is in contact with the lower surface 12b of the semiconductor substrate 12. The lower electrode 28 is in contact with the drain layer 30.

Figure 2:
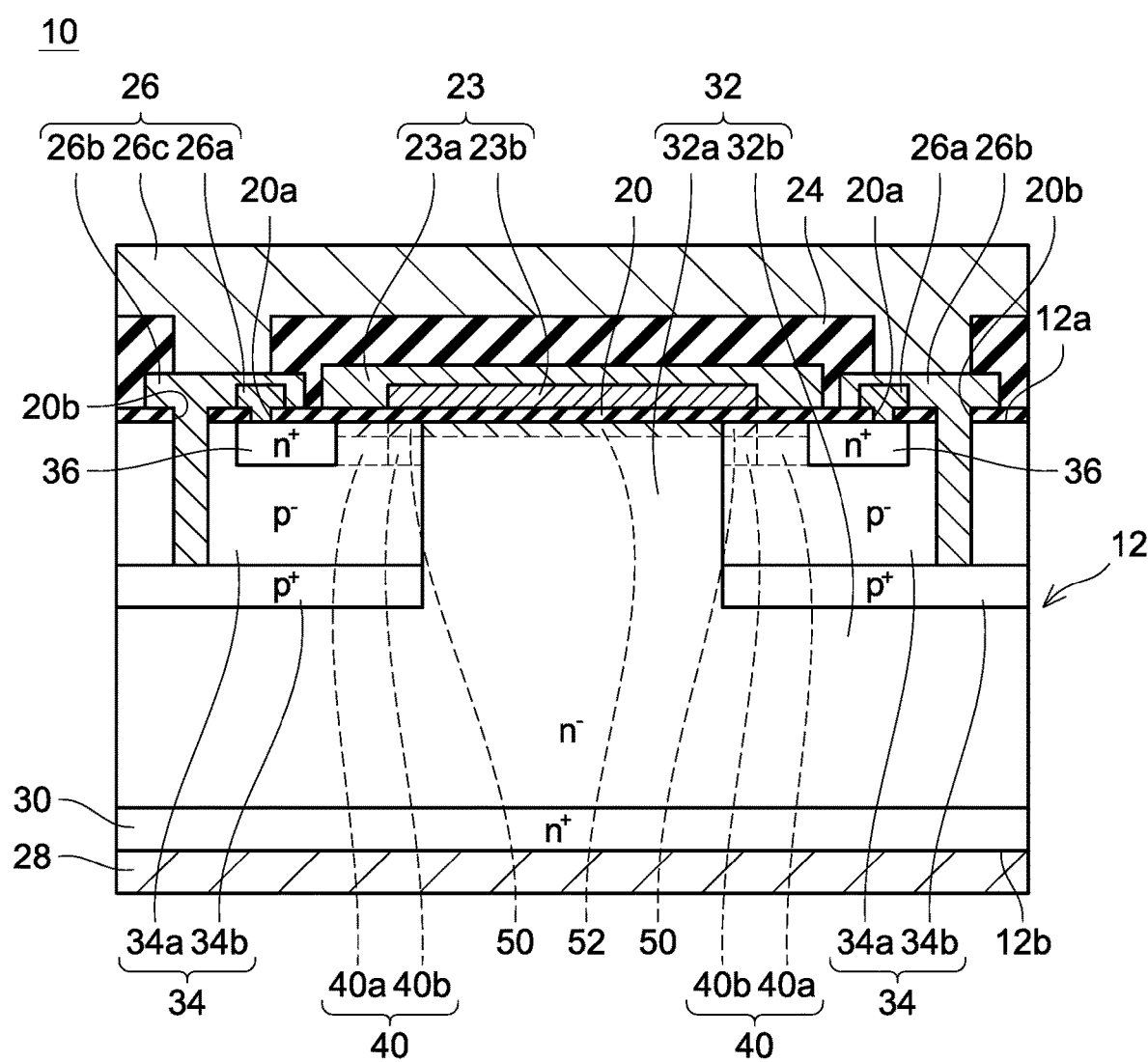
FIG. 2 is a diagram showing a channel and an electron accumulation layer in a cross section corresponding to FIG. 1.

Next, an operation of the switching device 10 will be described. A higher potential is applied to the lower electrode 28 than that to the upper electrode 26. When the potential of the gate electrode 23 (hereinafter termed a gate potential) is raised, electrons are attracted to surface portions of the channel portions 40 in the body layers 34 (a part close to the gate insulating film 20). Consequently, as shown in FIG. 2, a channel 50 is formed in the surface portions of the channel portions 40. This causes a flow of electrons from the source layers 36 to the window drift layer 32a via the channel 50. Moreover, when the gate potential is raised, electrons are also attracted to a surface portion of the window drift layer 32a (a part close to the gate insulating film 20). Consequently, as shown in FIG. 2, an electron accumulation layer 52 is formed in the surface portion of the window drift layer 32a. The electron accumulation layer 52 has a higher concentration of electrons and lower resistance than other portions in the drift layer 32. This causes electrons that have flowed into the window drift layer 32a to flow along the electron accumulation layer 52, and then flow downward from the electron accumulation layer 52. The formation of the electron accumulation layer 52 in the surface portion of the window drift layer 32a, as such, reduces the resistance of the window drift layer 32a. Electrons flow from the window drift layer 32a to the drain layer 30 via the base drift layer 32b. Since electrons flow from the source layers 36 to the drain layer 30 as such, the switching device 10 is turned on.

Figure 3:
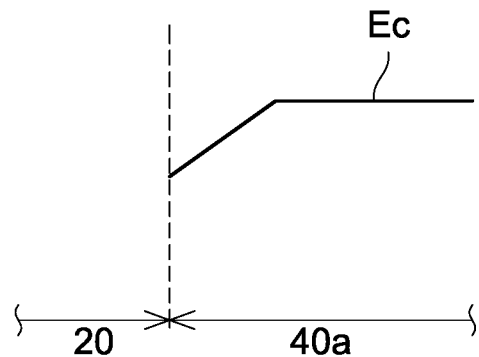
FIG. 3 is an energy band diagram of channel portions.
Figure 4:
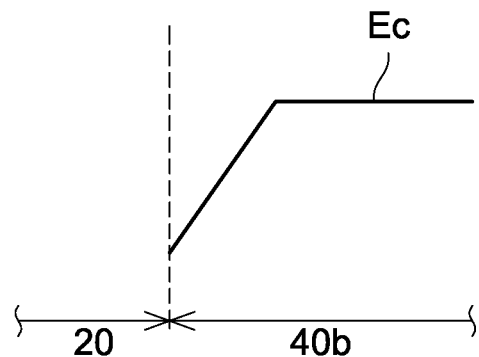
FIG. 4 is an energy band diagram of channel portions.

FIG. 3 shows a band gap diagram (energy Ec at a bottom of a conduction band) at an interface between the first channel portions 40a and the gate insulating film 20, and FIG. 4 shows a band gap diagram (energy Ec at the bottom of the conduction band) at an interface between the second channel portions 40b and the gate insulating film 20. Notably, each of FIGS. 3 and 4 shows a band gap diagram of when the switching device 10 is off. As shown in FIGS. 3 and 4, the band (the energy Ec) bends downward close to the gate insulating film 20 in both of the first channel portions 40a and the second channel portions 40b. As mentioned above, the first electric conductor 23a, which is located above the first channel portions 40a, has the work function larger than the work function of the second electric conductor 23b, which is located above the second channel portions 40b. Therefore, a degree of bending of the band close to the gate insulating film 20 is gentler in the first channel portions 40a than in the second channel portions 40b. This results in that the energy Ec close to the gate insulating film 20 is higher in the first channel portions 40a than in the second channel portions 40b. Accordingly, when the potential of the gate electrode 23 is raised, the channel 50 is less easily formed in the first channel portions 40a than in the second channel portions 40b. Therefore, when the potential of the gate electrode 23 is raised from a value less than a gate threshold value, the channel 50 is initially formed in the second channel portions 40b, and when the gate voltage is further raised, the channel 50 is then formed in the first channel portions 40a. Once the channel 50 has been formed in the first channel portions 40a, the channel 50 connects the source layers 36 and the window drift layer 32a. This results in that the gate voltage at which the channel 50 is formed in the first channel portions 40a serves as the gate threshold value. As such, allowing the first electric conductor 23a having a larger work function to be in contact with at least a part of the gate insulating film 20 above the channel portions 40 can raise the gate threshold value.

Figure 5:
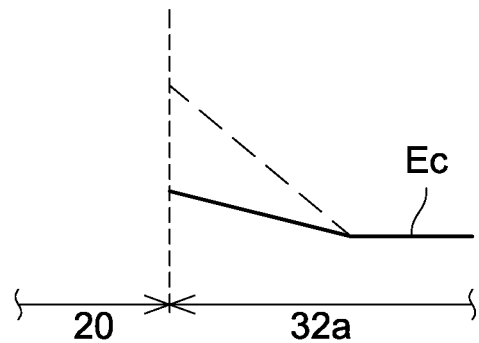
FIG. 5 is an energy band diagram of a window drift layer.

A graph in a solid line in FIG. 5 shows a band gap diagram (the energy Ec at the bottom of the conduction band) at an interface between the window drift layer 32a and the gate insulating film 20. Moreover, a graph in broken lines in FIG. 5 shows a band gap diagram in the case where the gate electrode 23 that is in contact with the gate insulating film 20 covering the window drift layer 32a is changed from the second electric conductor 23b (having a smaller work function) to the first electric conductor 23a (having a larger work function). Notably, FIG. 5 shows a band gap diagram of when the switching device is off. As shown in FIG. 5, the band (energy Ec) bends upward close to the gate insulating film 20. The bending degree of the band close to the gate insulating film 20 is gentler in the case where the gate electrode 23 has a smaller work function (the graph in a solid line) than in the case where the gate electrode 23 has a larger work function (the graph in broken lines). The energy Ec close to the gate insulating film 20 is therefore lower in the case where the gate electrode 23 has a smaller work function (the graph in a solid line) than in the case where the gate electrode 23 has a larger work function (the graph in broken lines). Accordingly, when the potential of the gate electrode 23 is raised, electrons are more easily attracted to the surface portion of the window drift layer 32a in the case where the gate electrode 23 has a smaller work function (the graph in a solid line) than in the case where the gate electrode 23 has a larger work function (the graph in broken lines). In the present embodiment, the second electric conductor 23b having a smaller work function is in contact with the entire surface of the gate insulating film 20 above the window drift layer 32a. This leads to formation of the electron accumulation layer 52 that has an extremely high electron density and extremely low resistance in the entirety of the surface portion of the window drift layer 32a. The on-resistance of the switching device 10 is thereby reduced.

As described above, allowing the first electric conductor that has a larger work function to be in contact with the gate insulating film 20 above the channel portions 40 can raise the gate threshold value. Moreover, allowing the second electric conductor that has a smaller work function to be in contact with the gate insulating film 20 above the window drift layer 32a can reduce the resistance of the electron accumulation layer 52. Configuring the gate electrode 23 with the first electric conductor 23a and the second electric conductor 23b can allow for both of a high gate threshold value and reduced resistance of the electron accumulation layer 52.

Moreover, in a case where p-type polysilicon that has high resistance is used as the second electric conductor 23b, the first electric conductor 23a can be located to cover the second electric conductor 23b, as in the embodiment mentioned above, so as to use the first electric conductor 23a as a gate wiring. The resistance of the gate wiring can thereby be reduced.

Figure 6:
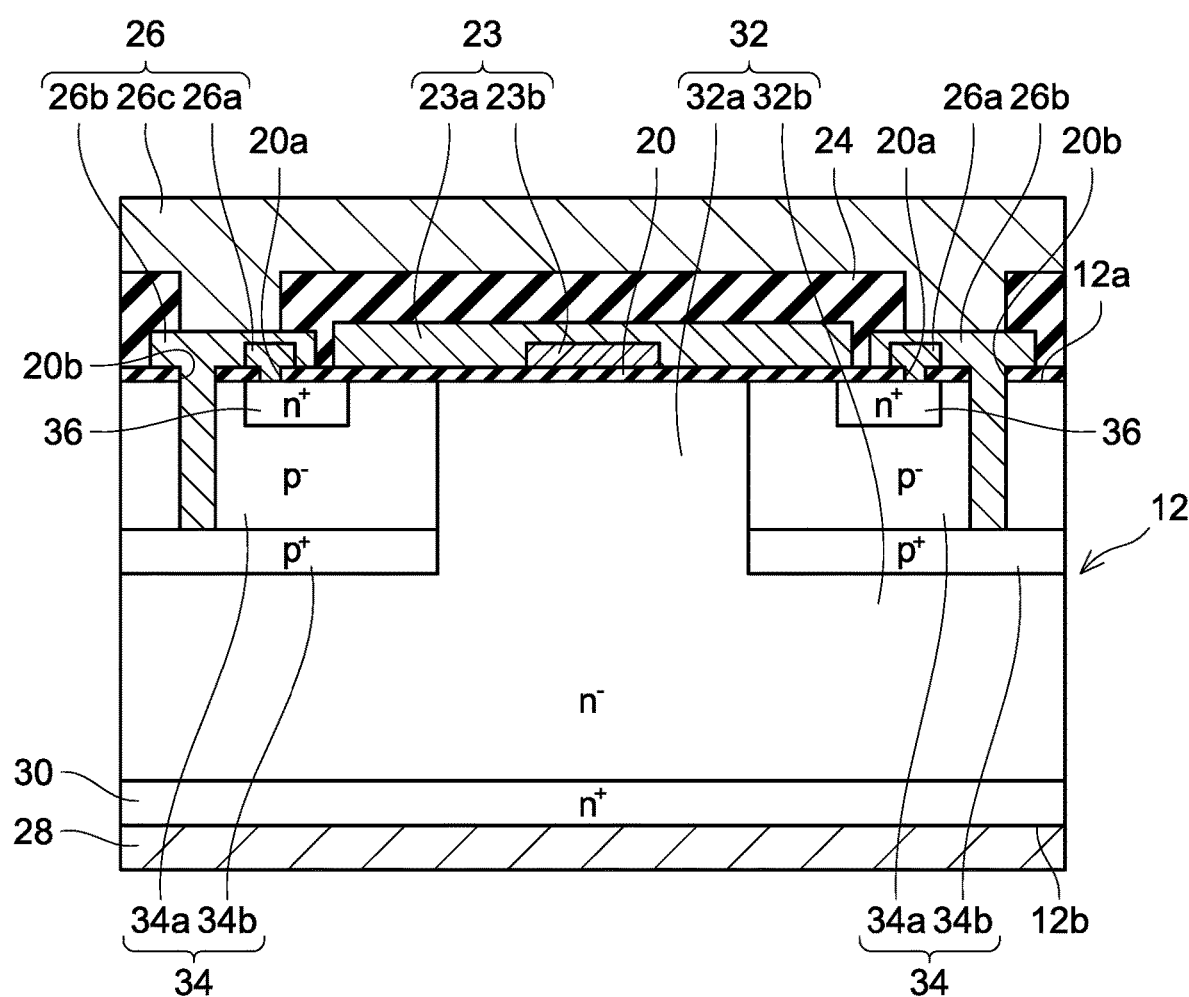
FIG. 6 is a cross-sectional view of a switching device in a variation.
Figure 7:
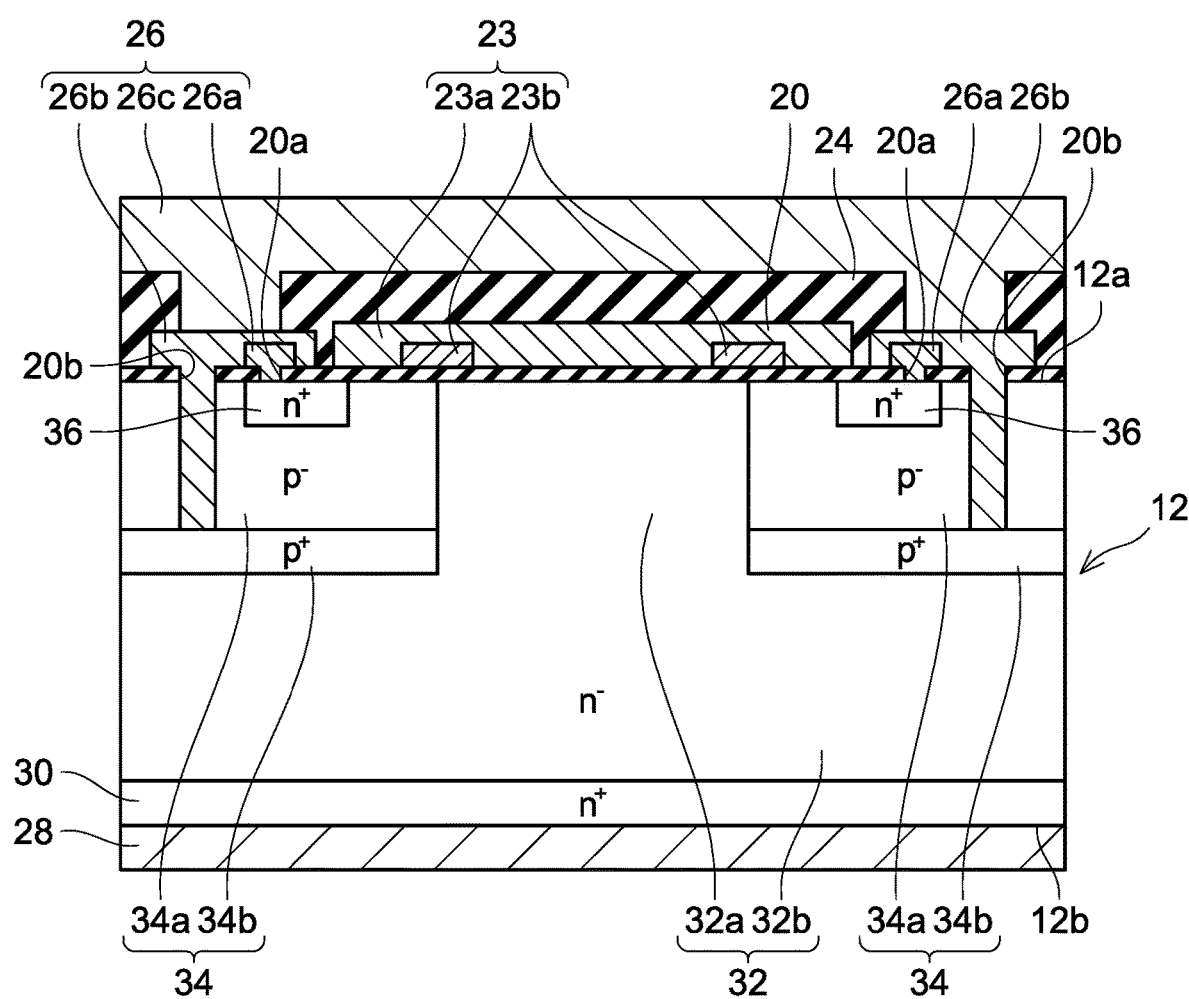
FIG. 7 is a cross-sectional view of a switching device in a variation.

Notably, location of the second electric conductor 23b can be changed arbitrarily. For example, as shown in FIG. 6, the second electric conductor 23b may be in contact with the gate insulating film 20 only above a central portion of the window drift layer 32a. With such a configuration as well, an electron accumulation layer that has extremely low resistance is formed in a surface portion of the central portion of the window drift layer 32a, so that the on-resistance of the switching device can be reduced. Moreover, as shown in FIG. 7, the second electric conductor 23b may be in contact with the gate insulating film 20 only above border portions between the body layers 34 and the window drift layer 32a. With this configuration, an electron accumulation layer that has a high electron density is formed in a range of the window drift layer 32a adjacent to the channel portions 40. The range of the window drift layer 32a adjacent to the channel portions 40 is a region where high-density electrons that have passed through the channel flow. Since a low-resistance electron accumulation layer is formed in this region, the on-resistance of the switching device can effectively be reduced. The configuration in FIG. 7 can further reduce the on-resistance of the switching device than the configuration in FIG. 6. It should be noted that allowing the second electric conductor 23b to be in contact with the entire surface of the gate insulating film 20 above the window drift layer 32a, as in FIG. 1, can further reduce the on-resistance of the switching device than in the configuration in FIG. 7.

Moreover, the location of the first electric conductor 23a above the channel portions 40 can be changed arbitrarily. In a cross section along a direction from each source layer 36 toward the window drift layer 32a, allowing at least a part of the surface of the gate insulating film 20 above the channel portions 40 to be in contact with the first electric conductor 23a can raise the gate threshold value.

Moreover, in the embodiment mentioned above, the source contact portions 26a of the upper electrode 26 may be constituted of a material same as a material of the second electric conductor 23b. An electric conductor having a small work function can be in contact with an n-type semiconductor with low resistance. Constituting the source contact portions 26a of the material the same as the material of the second electric conductor 23b having a smaller work function enables the source contact portions 26a to be in contact with the source layers 36 with low resistance. Moreover, in course of manufacturing, the second electric conductor 23b and the source contact portions 26a can be formed in a same process. The switching device can therefore be manufactured efficiently.

Moreover, in the embodiment mentioned above, the body contact portions 26b of the upper electrode 26 may be constituted of a material same as a material of the first electric conductor 23a. An electric conductor having a large work function can be in contact with a p-type semiconductor with low resistance. Constituting the body contact portions 26b of the material same as the material of the first electric conductor 23a having a larger work function enables each body contact portion 26b to be in contact with the corresponding high concentration layer 34b of the body layer 34 with low resistance. Moreover, in the course of manufacturing, the first electric conductor 23a and the body contact portions 26b can be formed in a same process. The switching device can therefore be manufactured efficiently.

In the embodiment mentioned above, description has been made of the switching device of a type in which the window drift layer 32a is located between each pair of the body layers 34. However, the technology disclosed herein may be applied to a switching device of another type, such as a trench-type switching device. The trench-type switching device can also allow for a high gate threshold value and low resistance of an electron accumulation layer by a gate electrode configured with a combination of electric conductors having different work functions. It should be noted that, in the switching device 10 in the embodiment, a depletion layer extends from each of the body layers 34, which are located on opposite sides of the window drift layer 32a, toward the window drift layer 32a, and hence the resistance of the window drift layer 32a tends to be high. Therefore, reducing the resistance of the window drift layer 32a by the electron accumulation layer can further reduce the on-resistance of the switching device.

Some of the features characteristic to below-described embodiments will herein be listed. It should be noted that the respective technical elements are independent of one another.

In an example of the switching device disclosed herein, the second electric conductor may be in contact with a part of the gate insulating film covering a border between the body layer and the drift layer.

According to this configuration, an electron accumulation layer having extremely low resistance can be formed at a position where electrons flow from a channel formed in the body layer into the drift layer (i.e., a part of the drift layer adjacent to the border between the body layer and the drift layer). The position where electrons flow from the channel formed in the body layer into the drift layer is a position where a current concentrates. Since the electron accumulation layer having extremely low resistance can be formed at the position where a current concentrates, the on-resistance of the switching device can effectively be reduced.

In an example of the switching device disclosed herein, the switching device may further comprise a semiconductor substrate, the body layer may include a plurality of body layers, and the source layer may include a plurality of source layers. The plurality of body layers may be located in the semiconductor substrate so as to be disposed at a surface of the semiconductor substrate and be separated from each other. The plurality of source layers may be located in the semiconductor substrate such that each source layer is surrounded by the corresponding body layer and is disposed at the surface of the semiconductor substrate. The drift layer may be located in the semiconductor substrate so as to be disposed at the surface of the semiconductor substrate in a range interposed between the plurality of body layers.

With this configuration, the drift layer is interposed between the plurality of body layers, so that the resistance of the drift layer tends to be high due to an influence of a depletion layer extending from each body layer. The provision of the second electric conductor having a smaller work function so as to be opposed to the drift layer can reduce the resistance of the drift layer.

In an example of the switching device disclosed herein, the gate insulating film may comprise a part covering the surface of the drift layer in the range interposed between the plurality of body layers. The second electric conductor may be in contact with an entirety of the part of the gate insulating film covering the surface of the drift layer in the range interposed between the plurality of body layers.

According to this configuration, the resistance of the drift layer can effectively be reduced.

In an example of the switching device disclosed herein, the switching device may further comprise: first contact electrodes constituted of a material same as a material of the first electric conductor, each first contact electrode being in contact with a corresponding one of the body regions; and second contact electrodes constituted of a material same as a material of the second electric conductor, each second contact electrode being in contact with a corresponding one of the source regions.

Since the first electric conductor having a larger work function is in contact with the p-type body layer with low resistance, the material same as the material of the first electric conductor can be implemented as the first contact electrodes for the body layers. Since the second electric conductor having a smaller work function is in contact with the n-type source layer with low resistance, the material same as the material of the second electric conductor can be implemented as the second contact electrodes for the source layers. According to this configuration, the first electric conductor of the gate electrode and the first contact electrodes can be formed simultaneously, and the second electric conductor of the gate electrode and the second contact electrodes can be formed simultaneously. According to these structures, the switching device can therefore be manufactured efficiently.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A switching device, comprising:
   a source layer of n-type;

a body layer of p-type being in contact with the source layer;
a drift layer of n-type being in contact with the body layer and separated from the source layer by the body layer;
a gate insulating film covering a range extending across a surface of the source layer, a surface of the body layer, and a surface of the drift layer; and
a gate electrode opposed to the source layer, the body layer, and the drift layer via the gate insulating film, wherein
the gate electrode comprises a first electric conductor and a second electric conductor having a work function smaller than a work function of the first electric conductor,
the first electric conductor is in contact with a part of the gate insulating film covering the body layer and the first electric conductor comprises nickel, gold, platinum, palladium, p-type polysilicon, or the like, and
the second electric conductor is in contact with a part of the gate insulating film covering the drift layer and the second electric conductor comprises titanium, aluminum, n-type polysilicon, or the like.

2. The switching device of claim 1, wherein the second electric conductor is in contact with a part of the gate insulating film covering a border between the body layer and the drift layer.

3. The switching device of claim 1, further comprising:
a semiconductor substrate, wherein
the body layer includes a plurality of body layers,
the source layer includes a plurality of source layers, the plurality of body layers is located in the semiconductor substrate so as to be disposed at a surface of the semiconductor substrate and be separated from each other,
the plurality of source layers is located in the semiconductor substrate such that each source layer is surrounded by a corresponding one of the body layers and is disposed at the surface of the semiconductor substrate, and
the drift layer is located in the semiconductor substrate so as to be disposed at the surface of the semiconductor substrate in a range interposed between the plurality of body layers.

4. The switching device of claim 3, wherein the gate insulating film comprises a part covering the surface of the drift layer in the range interposed between the plurality of body layers, and the second electric conductor is in contact with an entirety of the part of the gate insulating film covering the surface of the drift layer in the range interposed between the plurality of body layers.

5. The switching element of claim 3, further comprising:
first contact electrodes constituted of a material same as a material of the first electric conductor, each first contact electrode being in contact with a corresponding one of the body regions; and
second contact electrodes constituted of a material same as a material of the second electric conductor, each second contact electrode being in contact with a corresponding one of the source regions.

6. The switching device of claim 1, wherein
the gate insulating film covers a range extending across an upper surface of the source layer, an upper surface of the body layer, and an upper surface of the drift layer,
the gate electrode covers an upper surface of the gate insulating film,
the first electric conductor is in contact with the upper surface of the gate insulating film at a position right above an interface between the gate insulating film and the body layer, and
the second electric conductor is in contact with the upper surface of the gate insulating film at a position right above an interface between the gate insulating film and the drift layer.

7. A switching device, comprising:
a source layer of n-type;
a body layer of p-type being in contact with the source layer;
a drift layer of n-type being in contact with the body layer and separated from the source layer by the body layer;
a gate insulating film covering a range extending across a surface of the source layer, a surface of the body layer, and a surface of the drift layer; and
a gate electrode opposed to the source layer, the body layer, and the drift layer via the gate insulating film, wherein
the gate electrode comprises a first electric conductor and a second electric conductor having a work function smaller than a work function of the first electric conductor,
the first electric conductor is in contact with a part of the gate insulating film covering the body layer,
the second electric conductor is in contact with a part of the gate insulating film covering the drift layer,
the gate insulating film covers a range extending across an upper surface of the source layer, an upper surface of the body layer, and an upper surface of the drift layer,
the gate electrode covers an upper surface of the gate insulating film,
the first electric conductor is in contact with the upper surface of the gate insulating film at a position right above an interface between the gate insulating film and the body layer, and
the second electric conductor is in contact with the upper surface of the gate insulating film at a position right above an interface between the gate insulating film and the drift layer.

* * * * *